United States Patent
Brück et al.

(10) Patent No.: US 8,713,924 B2
(45) Date of Patent: May 6, 2014

(54) DEVICE AND METHOD FOR PRODUCING ELECTRICAL ENERGY FROM EXHAUST GAS AND MOTOR VEHICLE

(75) Inventors: Rolf Brück, Bergisch Gladbach (DE); Sigrid Limbeck, Much (DE)

(73) Assignee: EMITEC Gesellschaft fuer Emissionstechnologie mbH, Lohmar (DE)

( * ) Notice: Subject to any disclaimer, the term of this patent is extended or adjusted under 35 U.S.C. 154(b) by 201 days.

(21) Appl. No.: 13/162,957

(22) Filed: Jun. 17, 2011

(65) Prior Publication Data

US 2012/0011836 A1 Jan. 19, 2012

Related U.S. Application Data

(63) Continuation of application No. PCT/EP2009/065810, filed on Nov. 25, 2009.

(30) Foreign Application Priority Data

Dec. 17, 2008 (DE) .......................... 10 2008 063 487

(51) Int. Cl.
*F01N 3/02* (2006.01)

(52) U.S. Cl.
USPC ................................. 60/320; 60/274; 60/276

(58) Field of Classification Search
USPC ............. 60/320, 274, 282; 310/306; 136/224, 136/210, 208, 205

See application file for complete search history.

(56) References Cited

U.S. PATENT DOCUMENTS

| | | | |
|---|---|---|---|
| 5,625,245 A * | 4/1997 | Bass | 310/306 |
| 5,968,456 A | 10/1999 | Parise | |
| 6,732,507 B1 | 5/2004 | Stanglmaier et al. | |
| 2003/0140957 A1* | 7/2003 | Akiba | 136/224 |
| 2005/0039729 A1 | 2/2005 | Rosin et al. | |
| 2005/0204733 A1* | 9/2005 | Sasaki | 60/320 |
| 2005/0217714 A1* | 10/2005 | Nishijima et al. | 136/204 |
| 2006/0272316 A1* | 12/2006 | Miyashita | 60/282 |
| 2007/0193617 A1 | 8/2007 | Taguchi | |

(Continued)

FOREIGN PATENT DOCUMENTS

| | | |
|---|---|---|
| DE | 102005015016 A1 | 11/2005 |
| FR | 2 512 499 | 3/1983 |
| JP | 2000035213 A | 2/2000 |
| JP | 2000035824 A | 2/2000 |

(Continued)

OTHER PUBLICATIONS

International Search Report of PCT/EP2009/065810, Dated March 4, 2010.

*Primary Examiner* — Thomas Denion
*Assistant Examiner* — Patrick Maines
(74) *Attorney, Agent, or Firm* — Laurence A. Greenberg; Werner H. Stemer; Ralph E. Locher

(57) ABSTRACT

A device and a method for producing electrical energy from an exhaust gas of an internal combustion engine include a generator with an exhaust gas inlet, an exhaust gas outlet and a heat exchange portion therebetween. The heat exchange portion includes a plurality of flow paths for the exhaust gas. The flow paths are at least partially surrounded by thermoelectric elements which are in thermally conductive communication with a cooling device on a side facing away from the flow path. A motor vehicle having the device or carrying out the method, is also provided.

14 Claims, 5 Drawing Sheets

(56) References Cited

U.S. PATENT DOCUMENTS

| | | |
|---|---|---|
| 2009/0126772 A1* | 5/2009 | Machida .................. 136/222 |
| 2010/0154396 A1* | 6/2010 | Hahnl et al. .................. 60/320 |
| 2010/0193000 A1* | 8/2010 | Prenninger et al. .......... 136/203 |
| 2010/0269878 A1* | 10/2010 | Kuhlbach .................. 136/201 |
| 2011/0120106 A1* | 5/2011 | Bruck et al. .................. 60/320 |
| 2011/0185715 A1* | 8/2011 | Limbeck et al. ............. 60/320 |
| 2011/0308771 A1* | 12/2011 | Heckenberger et al. . 165/104.14 |
| 2012/0174567 A1* | 7/2012 | Limbeck et al. ............. 60/320 |

FOREIGN PATENT DOCUMENTS

| | | |
|---|---|---|
| JP | 2003219674 A | 7/2003 |
| JP | 2005294695 A | 10/2005 |
| JP | 2006083725 A | 3/2006 |
| JP | 2006214350 A | 8/2006 |
| KR | 1020040060716 A | 7/2004 |
| KR | 1020040079426 A | 9/2004 |
| WO | 2005/098225 A1 | 10/2005 |
| WO | 2009/138412 A1 | 11/2009 |

* cited by examiner

DEVICE AND METHOD FOR PRODUCING ELECTRICAL ENERGY FROM EXHAUST GAS AND MOTOR VEHICLE

CROSS-REFERENCE TO RELATED APPLICATION

This is a continuation, under 35 U.S.C. §120, of copending International Application No. PCT/EP2009/065810, filed Nov. 25, 2009, which designated the United States; this application also claims the priority, under 35 U.S.C. §119, of German Patent Application DE 10 2008 063 487.5, filed Dec. 17, 2008; the prior applications are herewith incorporated by reference in their entirety.

BACKGROUND OF THE INVENTION

Field of the Invention

The present invention relates to a device for producing electrical energy from exhaust gas of an internal combustion engine using a generator. The invention relates, in particular, to a generator for converting thermal energy of exhaust gas into electrical energy, that is to say a so-called thermoelectric generator. The invention also relates to a method for producing electrical energy from exhaust gas and a motor vehicle having the device or carrying out the method.

Exhaust gas from an engine of a motor vehicle possesses thermal energy, which is to be converted into electrical energy through the use of a thermoelectric generator in order to charge a battery or some other energy storage device, for example, or to deliver the necessary energy directly to electrical consumers. A greater amount of energy is thereby available for the operation of the motor vehicle.

Such a thermoelectric generator generally includes a plurality of thermoelectric converter elements. Thermoelectric materials are of a type which is capable of efficiently converting thermal energy into electrical energy (Seebeck effect) and vice-versa (Peltier effect). The 'Seebeck effect' is based on the phenomenon whereby thermal energy is converted into electrical energy and is used to produce thermoelectric energy. The 'Peltier effect' is the reverse of the Seebeck effect and is a phenomenon which is accompanied by heat adsorption, and is caused in the context of a current flow through different materials. The Peltier effect has already been proposed as a method of thermoelectric cooling, for example.

Such thermoelectric converter elements preferably include a number of thermoelectric elements, which are positioned between a so-called 'warm side' and a so-called 'cold side'. Thermoelectric elements include, for example, at least two semiconductor blocks (p-type and n-type) which on their upper and lower side (respectively facing the 'hot side' and 'cold side') are alternately connected to electrically conductive bridges. Ceramic plates or ceramic coatings and/or similar materials serve for insulation of the metal bridges and are therefore preferably disposed between the metal bridges. If a temperature gradient is provided on both sides of the semiconductor blocks, a voltage potential is formed. In that case heat is absorbed at one contact point ('warm side'), with the electrons passing from the one side to the higher-energy conduction band of the following block. On the other side, the electrons can now release energy to return to the other side at the lower energy level ('cold side'). A flow of current can therefore occur given a corresponding temperature gradient.

Attempts have already been made to provide corresponding thermoelectric generators for use in motor vehicles, particularly in passenger motor vehicles. They were generally very expensive to manufacture, however, and distinguished by a relatively low efficiency. They have therefore as yet not been suitable for mass production.

SUMMARY OF THE INVENTION

It is accordingly an object of the invention to provide a device and a method for producing electrical energy from exhaust gas and a motor vehicle having the device or carrying out the method, which overcome the hereinafore-mentioned disadvantages and at least partially solve the highlighted problems of the heretofore-known devices, methods and motor vehicles of this general type. It is sought, in particular, to specify a thermoelectric generator, which affords improved efficiency in converting available thermal energy into electrical energy and which, in particular, is also capable of withstanding variable stresses occurring in exhaust system of mobile internal combustion engines.

With the foregoing and other objects in view there is provided, in accordance with the invention, a device for producing electrical energy from an exhaust gas of an internal combustion engine. The device comprises a generator having an exhaust gas inlet, an exhaust gas outlet and a heat exchange portion disposed between the exhaust gas inlet and the exhaust gas outlet. The heat exchange portion has a multiplicity of flow paths for the exhaust gas. Thermoelectric elements at least partially surround the flow paths and have a side which faces away from one of the flow paths and is in thermally conductive communication with a cooling device. At least one of the flow paths has at least one element for flow manipulation or different types of the thermoelectric elements are disposed at least along one of the flow paths. An embodiment with the combined use of the latter features is preferred.

The device is, in particular, a so-called thermoelectric generator. The exhaust-gas inlet and the exhaust-gas outlet may be constructed, in particular, as part of an exhaust system or of an exhaust pipe. It is also possible, however, to provide multiple exhaust-gas inlets and/or multiple exhaust-gas outlets. The heat exchange portion forms the core of the generator. This relates, in particular, to a part of the flow path of the exhaust gas through the generator in which the exhaust gas gives off thermal energy to the heat exchange units. It is possible for the exhaust gas to flow through multiple such heat exchange portions on its path through the generator, although the variant in which the exhaust gas flows through only one (continuous) heat exchange portion is preferred.

In order to now provide the largest possible contact surfaces for the exchange of heat, the exhaust-gas flow is split up into flow paths, and in particular small ducts. Flow paths may be formed by directional and/or non-directional passages for the exhaust gas, for example as a result of the exhaust gas being split up in a regular and/or irregular manner within the heat exchange portion, wherein it is generally possible that the exhaust-gas partial flows (can) mix with one another again (repeatedly) within the heat exchange portion.

The flow paths are preferably distinctly separated from one another (for example by a continuous duct wall). In the case of flow paths and/or ducts it may also be possible in specific instances, however, for the flow paths or ducts to communicate with one another through connecting ducts and/or openings. The flow paths or ducts preferably number significantly more than 20, for example at least 50 or even at least 100 ducts. The ducts thereby have an opening cross section which is significantly reduced as compared to that of the exhaust-gas inlet, so that a significantly enlarged heat exchange area, formed by the walls of the flow paths/ducts, is available.

One or two heat exchange units with the thermoelectric elements and the cooling device are preferably disposed adjacent the flow paths. It may be preferable for the ducts to be contiguous with the heat exchange units, that is to be in thermally conductive contact. In this case the thermoelectric elements are preferably disposed along the ducts, with it being very particularly preferable for a plurality of thermoelectric elements of different type to be positioned in each case over the length of a flow path in the heat exchange portion. The cooling device is disposed on that side of the thermoelectric elements which faces away from the flow paths. In this case, the thermoelectric elements are, in particular, captively connected to the cooling device. This means, in particular, that the thermoelectric elements are cohesively connected only to the cooling device or to some of the heat exchange units. The thermally conductive contact to the flow paths therefore, in particular, ensues only through a contiguous contact without any cohesive connection. In this context 'captively' is intended to signify that a relative movement of the thermoelectric elements in relation to the cooling device is not possible (without dismantling) while the device is in operation, that is to say the thermoelectric elements are welded, soldered, brazed, bonded, anchored, screwed or clamped or securely fixed in some other way to the cooling device or heat exchange unit, wherein at the same time areal contact between the thermoelectric elements and the cooling device is ensured, which does not hinder the conduction of heat between them.

In a preferred refinement of the device, the exhaust-gas inlet and exhaust-gas outlet are disposed opposite one another and the heat exchange units are disposed radially thereto. The exhaust-gas inlet and exhaust-gas outlet may thereby be integrated into a rectilinear, tubular exhaust line, for example. The heat exchange units are disposed radially around and perpendicularly to the exhaust line, so that the exhaust gas for producing electrical energy has to be diverted radially out of the main direction of flow, passes through the heat exchange portion and then has again to be diverted once and/or repeatedly in order to flow out again through the exhaust-gas outlet in the main direction of flow. Not only does this afford an especially compact construction, but the diversion increases a turbulent flow of the exhaust gas, so that in the downstream heat exchange portion an especially close contact is achieved with the walls of the ducts, thereby ensuring a good heat transfer to the thermoelectric elements.

The heat exchange units and the cooling device are moreover advantageously formed with plate elements, on which the thermoelectric elements are positioned. The cooling ducts, through which a coolant is conducted, for example, can thus be formed between two superimposed plate elements. The cooling device and the heat exchange units are thereby relatively stable and robust, so that, in particular, any escape of coolant is prevented. This means, however, that the plate elements also afford the possibility of the attachment of the thermoelectric elements, which are preferably formed on a side of a plate element facing away from the cooling device. The thermoelectric element is thereby disposed, for example, on that surface of a plate element on which the ducts for the exhaust-gas flow are then also disposed. The plate elements may be provided as modules and put together in the desired form for ease of assembly. This represents a relatively cost-effective way of manufacturing such a thermoelectric generator.

It is particularly advantageous in this respect for such a plate element to be constructed with an internal cooling device and thermoelectric elements on both sides facing the adjacent flow paths. The internal cooling device may be formed by milled or bored or otherwise manufactured cooling ducts, with it being possible (but not preferable) to incorporate an additional material into the ducts where necessary. It is advantageous, however, for the plate elements themselves to be formed from highly thermally conductive materials, so as to ensure an optimum transfer of the thermal energy produced from the exhaust gas to the heat exchange units and hence into the thermoelectric elements. In addition, these plate elements afford the possibility of a stable and protected configuration of electrical lines to thermoelectric elements.

It is also proposed in this context to form the plate element with a metal foil which is provided with thermoelectric elements and is covered by a protective layer. In this case, the metal foil may have a structure so that a stack of at least two metal foils forms ducts between them, in particular for the coolant. The plate element thereby has a low thermal mass and is very light. A protective layer, which in particular prevents exhaust gas on the upper side from coming into contact with the covered thermoelectric elements, moreover provides for a captive connection between the thermoelectric elements and the metal foil. The protective layer may take the form of a coating and/or a separate component (such as a further metal foil, for example).

The ducts that can be produced by the stacking of plate elements and through which the exhaust gas flows may also be produced by structured metal foils. In this case, multiple metal foils may be disposed one on top of another, so that ducts can also be provided which are not disposed adjacent thermoelectric elements.

The thermoelectric elements which are used may, for example, differ in terms of type according to at least one of the following characteristics: structure, material, size, electrical connection, contact area, etc. The use of different types of thermoelectric elements over the length of the flow paths permits a more targeted and more effective utilization of the thermal energy of the exhaust gas flowing through.

The embodiment which is proposed alternatively or in addition, with at least one element for flow manipulation, has the function of improving the conduction of heat from the exhaust gas flowing through to the thermoelectric elements. The element may be an additional component and/or a part of the wall of the flow path. It is sought in this way, in particular, to influence the contact between the exhaust gas and the wall of the flow path (as a function of load and/or as a function of temperature and/or as a function of position).

In accordance with another feature of the invention, the thermoelectric elements of different type means, in particular, elements with different efficiency or with different maximum efficiency. In this case, the efficiency of an element of one type with regard to the conversion of thermal energy to electrical energy has at least one maximum in relation to an average exhaust-gas temperature. The thermoelectric elements are preferably disposed, with regard to their different efficiencies, in a first portion or in at least one second portion of a flow path. The sections refer, in particular, to regions of the flow paths of the exhaust gas through the generator with different average exhaust-gas temperature. The thermoelectric elements with different efficiency maxima should accordingly be disposed in such a way that the respective efficiency maxima are adapted to the average prevailing exhaust-gas temperature in the respective portion of the flow path in each case. Accordingly, thermoelectric elements which have an efficiency maximum in the region of relatively high temperatures should be provided in the region of the exhaust-gas inlet, and correspondingly, thermoelectric elements which have their efficiency maximum at relatively low temperatures should be provided in the vicinity of the exhaust-gas outlet. This permits an improved conversion of the available thermal energy into electrical energy.

Aside from a configuration of the thermoelectric elements in series in the flow direction of the exhaust gas, the thermoelectric elements may be constructed in corresponding configurations depending on the average prevailing temperature in the flow path. In this regard, the at least one flow path is divided into at least one first portion and at least one further second portion, in which thermoelectric elements with the same efficiency maximum in each case are disposed.

In accordance with a further feature of the device of the invention, at least one flow path has guide blades and/or thermally conductive structures. The aim of this is for as large an amount of thermal energy as possible to be transferred from the exhaust gas to the thermoelectric elements. Guide blades may serve, in particular, to deflect exhaust gas out of a region of the flow path remote from the wall toward the surfaces of the duct which are directly connected in thermally conductive fashion to the thermoelectric elements. Guide blades have, in particular, a surface which projects into the flow path and which is suitable for causing at least a part of the exhaust-gas flowing through the flow path to be deflected toward the thermoelectric elements. This refinement (and that discussed below in terms of flow) relates, in particular, to the embodiment of the device formed with identical thermoelectric elements, and provided only with elements for flow manipulation. The guide blades and/or thermally conductive structures therefore serve to influence the contact between the exhaust gas and the wall of the flow path in a targeted manner (as a function of load and/or as a function of temperature and/or as a function of position).

The thermally conductive structures are, in particular, metallic thermally conductive structures which extend at least over a part of the length of a flow path, project into the latter and only subject the exhaust-gas flow to a low flow resistance. The thermally conductive structures therefore preferably have a thin and areal construction, in particular in the manner of a cooling rib. The thermally conductive structures thereby permit the absorption of heat from the entire flow path cross section, through which the exhaust gas flows. The thermally conductive structures should be formed with high thermal conductivity, so as to allow the heat energy transferred from the exhaust gas to be dissipated to the thermoelectric elements.

In this case, the thermally conductive structures are disposed, in particular, in the downstream portions of the flow paths, in such a way that in regions of "relatively cold" exhaust gas, the existing residual heat of the exhaust gas can be dissipated to a greater extent from the exhaust-gas flow. Overheating of the thermoelectric elements disposed in regions of "relatively hot" exhaust gas, that is to say directly downstream of the exhaust-gas inlet of the generator, is thus simultaneously prevented. The peak temperatures of the exhaust gas occur specifically in this case and at specific operating points of the internal combustion engine, the peak temperatures may be so high that damage to the thermoelectric elements is possible. An additional dissipation of thermal energy from the hot exhaust gas to the thermoelectric elements therefore increases the probability of damage. In the portions further downstream, the exhaust gas has already cooled to such an extent that damage as a result of temperature peaks can be reliably avoided.

In particular, structures should be provided which combine in one structure the function of guide blades, which at least partially divert the exhaust gas, and the function of thermally conductive structures, which dissipate the heat from the exhaust gas to the thermoelectric elements through the use of large contact surfaces and good thermal conduction properties.

In accordance with an added feature of the device of the invention, at least one flow path has structures and/or profilings or profiled structures on first walls of the flow path. Profilings or structures are intended, in particular, to prevent or reduce laminar boundary flows of the exhaust gas within the flow path, in such a way that firstly, as a result of turbulence generated in this way, exhaust gas remote from the wall is supplied to the first walls, and therefore a higher proportion of thermal energy can be dissipated out of the exhaust gas. Furthermore, through the use of the structures and/or profilings, the dynamic pressure of the exhaust gas within the flow path should be increased in such a way that, as a result of the vortices generated in this way and the enforced longer residence time of the exhaust gas within the flow path, an improved transfer of heat from the exhaust gas to the thermoelectric elements is attained. In this case, first walls denote surfaces of the flow paths/ducts which themselves are in direct thermally conductive connection or communication with the thermoelectric elements. Structures denote, in particular, surfaces which have been generated by incisions into the walls of the flow paths and which project into the flow paths. In contrast, profilings denote surfaces of the flow paths which are formed by a closed surface region of the walls of the flow paths, for example knobs, knolls, elevations, kinks, waves.

In this case, the structures and profilings are disposed, in particular, in the downstream portions of the flow paths, in such a way that the existing residual heat of the exhaust gas can be dissipated to a greater extent from the exhaust-gas flow in regions of "relatively cold" exhaust gas as a result of the generation of turbulence and the prevention of laminar boundary flows. Overheating of the thermoelectric elements disposed in regions of "relatively hot" exhaust gas, that is to say directly downstream of the exhaust-gas inlet of the generator, is thus simultaneously prevented.

In accordance with an additional feature of the device of the invention, with increasing dynamic pressure, the exhaust gas within at least one flow path is at least partially transferred into an adjacent bypass flow path.

In this way, it is achieved in particular that an overloading of the thermoelectric elements as a result of excessively high exhaust-gas temperatures is avoided. In this case, at least a part of the exhaust gas present in one flow path is, with increasing pressure and/or above a specific, presettable pressure, transferred to an increasing extent into an adjacent, preferably substantially parallel flow path, which in particular is not in direct contact with thermoelectric elements. It is thereby achieved that, in the flow path adjacent the thermoelectric elements, an exhaust-gas temperature prevails which corresponds to the efficiency maximum of the thermoelectric elements. The adjacent bypass flow path is, in particular, separated by second walls from the flow path which is in direct thermally conductive contact with the thermoelectric elements. The second walls are therefore not in direct thermally conductive contact with the thermoelectric elements. The second walls are, in particular, provided at least partially with openings so as to permit a transfer of the exhaust gas out of the flow path into the bypass flow path.

With regard to the statements made above, the invention consequently also relates to a device for producing electrical energy from the exhaust gas of an internal combustion engine, comprising a generator having an exhaust-gas inlet and an exhaust-gas outlet and a heat exchange portion between them, wherein the heat exchange portion has a plurality of flow paths for the exhaust gas, wherein the flow paths are at least partially surrounded by thermoelectric elements which, on the side facing away from the flow path, are connected or in communication in thermally conductive fashion to a cooling device, in which device at least one bypass flow path is provided, wherein with increasing dynamic pressure, the exhaust gas within at least one flow path is at least partially transferred into an adjacent bypass flow path. Since an improvement in relation to the prior art is also separately achieved in this way, this concept may also be pursued independently. Refinements of the concept may be gathered from the following explanations (in particular the following two paragraphs and the illustrations of the self-regulating overload protection method).

In accordance with yet another particularly advantageous feature of the invention, the bypass flow path is formed by a body which is disposed in the flow path and which has an open base surface and which tapers counter to the flow direction of the exhaust gas within the flow path and which has a second wall through which the exhaust gas can flow. The body may be constructed, in particular, in the form of a cone or of a bevel. In this case, the body is, in particular, formed from the same material as the walls or the surface of the flow path, and if appropriate even in one piece with the latter, that is to say in a form-locking or force-locking manner. A form-locking connection is one which connects two elements together due to the shape of the elements themselves, as opposed to a force-locking connection, which locks the elements together by force external to the elements. The second wall which forms the body is thus, in particular, not in thermally conductive contact with the thermoelectric elements, that is to say is at least for the most part not in contact with first walls, and is disposed within the flow path.

Furthermore, the second wall of the body is constructed to be gas-permeable in such a way that exhaust gas from the flow path can pass into the body and then to the exhaust-gas outlet. With increasing dynamic pressure of the exhaust gas, an ever increasing amount of the exhaust gas will now already enter into the body through the first openings within the second wall, and therefore will dissipate no heat (or only a small amount of heat) to the first walls of the flow path which are in contact with the thermoelectric elements. In this case, the body and/or the bypass flow path should be provided in such a way that the openings extend preferably over the entire length of the flow path, so that exhaust gas from the first portions of the flow path can already enter into the bypass flow path or into the body, in such a way that overheating, in particular of the thermoelectric elements disposed in the region of the exhaust-gas inlet, is avoided.

Furthermore, additional cooling may be provided for at least one part of the heat exchange portion. This means, for example, that a second cooling circuit may be activated according to demand. The additional cooling device is very particularly preferably a reversed connection of the thermoelectric elements, in such a way that they act as Peltier elements. The thermoelectric elements can therefore then cool the heat exchange portion and/or themselves in the event of excessively hot exhaust gas flowing through the thermoelectric generator.

In accordance with yet a further feature of the invention, the device is formed with at least one catalytic converter portion which is at least partially positioned upstream of the heat exchange portion in terms of flow. In this case, it is very particularly preferable for the exhaust gas which is diverted into the heat exchange portion to firstly flow over the catalytic converter portion and to subsequently reach the heat exchange portion. It is very particularly preferable for the exhaust gas to flow in opposite directions through the catalytic converter portion and the heat exchange portion. A radial honeycomb structure is preferably provided in the catalytic converter portion. The honeycomb structure of the catalytic converter portion is coated with a washcoat and an oxidation catalyst (preferably platinum). In the catalytic converter portion, as a result of the catalytic conversion of constituents of the exhaust gas, an exothermic reaction is initiated which increases the thermal energy in the exhaust gas. The now "preheated" exhaust gas then serves to generate a greater amount of thermoelectric energy. The catalytic converter portion may, if appropriate, be formed with different coatings and/or catalysts. It is also possible for the catalytic converter portion to be constructed variably with regard to the contact region and/or the supplied exhaust gas, in order to thereby regulate the temperature increase in a targeted manner. In particular, it is also possible for at least partial regions of the ducts and walls of the further regions of the generator through which exhaust gas flows, in particular at least partial regions of the ducts of the heat exchange portion, to be coated with washcoat and an oxidation catalyst. In this case, first walls, that is to say those regions of the ducts which directly adjoin a thermoelectric element, are preferably not provided with such a coating, because in this way the thermal conductivity from the flow paths to the thermoelectric elements can be impaired.

In accordance with yet an added advantageous feature of the invention, the oxidation catalytic converter is heatable. In this way, the oxidation catalytic converter reaches its light-off temperature particularly quickly and therefore a catalytic conversion of the exhaust gas begins. The temperature of the exhaust gas, and therefore also the efficiency of the generator, is therefore increased more quickly.

In accordance with yet an additional feature of the invention, at least one NOx accumulator is provided downstream of the heat exchange portion. Such a configuration is advantageous in particular because, as a result of the dissipation of a large amount of heat from the exhaust gas, only a low exhaust-gas temperature prevails downstream of the device. The temperature, in particular, lies below a desorption temperature of the NOx accumulator for long periods of time, so that nitrogen oxides can be reliably removed from the exhaust gas and converted within the exhaust system, for example by SCR components.

With the objects of the invention in view, there is also provided a method for producing electrical energy from an exhaust gas of an internal combustion engine. The method comprises providing a device including a generator having an exhaust gas inlet, an exhaust gas outlet and a heat exchange portion disposed between the exhaust gas inlet and the exhaust gas outlet, providing the heat exchange portion with a multiplicity of flow paths for the exhaust gas, providing a cooling device, at least partially surrounding the flow paths with thermoelectric elements having a side facing away from one of the flow paths being in thermally conductive communication with the cooling device, and regulating a thermally conductive contact between the exhaust gas and the thermoelectric elements at least as a function of an overall mass flow or temperature of the exhaust gas.

In accordance with another particularly advantageous mode of the invention, the thermally conductive contact between the exhaust gas and the thermoelectric elements is regulated in a self-regulating manner at least as a function of the overall mass flow or temperature of the exhaust gas.

The regulation of the thermally conductive contact is realized, in particular, by an overload protection device which is provided, in particular, for all flow paths which are directly connected or in communication in a thermally conductive manner to thermoelectric elements through first walls. The self-regulating overload protection is realized, in particular, by a bypass flow path which is disposed adjacent and, in particular, substantially parallel to the flow path and which is provided, in particular, within the flow path. In this case, only a very small part of the existing exhaust-gas flow which has entered the device through the exhaust-gas inlet flows through the at least one flow path with overload protection in each case. In particular, the flow path is constructed in such a way that only at most 5 vol %, preferably at most 1 vol %, particularly preferably at most 0.1 vol % of the exhaust-gas flow flowing into the device through the exhaust-gas inlet flows through the flow path.

In accordance with a further advantageous mode of the invention, the method has a self-regulating overload protection device which causes an increasing amount of exhaust gas to be separated in terms of flow from first walls of a flow path in a self-regulating manner as a function of the dynamic pressure of the exhaust gas. In this case, the self-regulating overload protection device is constructed in such a way that, with increasing dynamic pressure, a continuously increasing amount of exhaust gas does not make contact with the first walls of a flow path but rather, in particular, enters into an adjacent bypass flow path which is not in direct thermally conductive connection with the thermoelectric elements.

In a further embodiment, the self-regulating overload protection device is constructed in such a way that an increasing amount of exhaust gas is separated in terms of flow from first walls of a flow path only above a certain dynamic pressure level.

The methods for overload protection are used specifically in a device which has a bypass flow path as described above in the independent concept.

With the objects of the invention in view, there is concomitantly provided a motor vehicle, in particular a passenger motor vehicle, comprising an internal combustion engine, and a device for carrying out the method according to the invention for producing electrical energy from exhaust gas of the internal combustion engine.

Other features which are considered as characteristic for the invention are set forth in the appended claims, noting that the features specified individually in the claims may be combined with one another in any desired technologically expedient manner and form further embodiments of the invention.

Although the invention is illustrated and described herein as embodied in a device and a method for producing electrical energy from exhaust gas and a motor vehicle having the device or carrying out the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
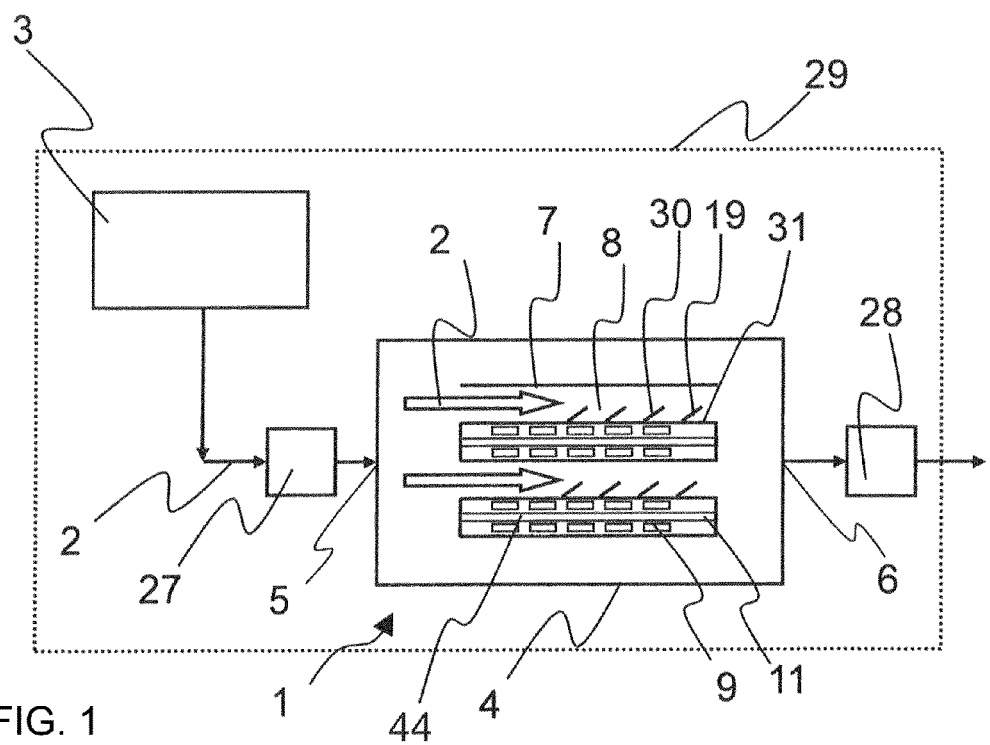
FIG. 1 is a diagrammatic, plan view of a motor vehicle in which a device according to the invention is integrated.

Referring now in detail to the figures of the drawing for explaining the invention and the technical field in more detail by showing particularly preferred structural variants to which the invention is not restricted, and first, particularly, to FIG. 1 thereof, there is seen a diagrammatic illustration of a preferred use of a device 1 according to the invention in a motor vehicle 29 having an internal combustion engine 3. Exhaust gas 2 produced in the internal combustion engine 3, for example an Otto engine or a diesel engine, flows to exhaust-gas purification components 27, 28.

The device 1 according to the invention is advantageously disposed directly downstream of the internalh combustion engine 3 or in a corresponding exhaust-gas purification system. The device may also be provided as part of an exhaust-gas recirculation system, in which an exhaust-gas cooler can advantageously be used. In the figures described below, elements for flow manipulation 30 may be provided in the form of guide blades 15, thermally conductive structures 16, structures 19, profiled sections 20, a body 24 and a bypass flow path 23 or overload protection device 17.

According to an advantageous embodiment, an oxidation catalytic converter 27 is connected upstream of the device 1, although the oxidation catalytic converter 27 may also be at least partially integrated in the device 1. A $NO_x$ accumulator 28 is advantageously connected downstream of the device 1, although the NOx accumulator may likewise be at least partially integrated into the device 1, The device 1 has an exhaust-gas inlet 5 through which the exhaust gas 2 flows into the device 1. A generator 4 of the device 1 is formed in this case by a heat exchange portion 7 which is constructed, in particular, from a multiplicity of heat exchange units 44 with thermoelectric elements 9 and at least one cooling device 11 which is provided between flow paths 8. In this way, thermal energy of the exhaust gas 2 can be conducted through surfaces 31 of the flow path 8 to the thermoelectric elements 9, which can produce an electrical current as a result of a temperature potential between the warm exhaust gas 2 and the cooling device 11, Structures 19 are introduced as elements for flow manipulation 30. Said structures 19, which are preferably disposed within the flow paths 8, firstly cause turbulence formation in the exhaust gas 2 in such a way that a heat transfer from the exhaust gas 2 to the surfaces 31 of the flow path 8 is improved. The exhaust gas 2 leaves the generator 4 through an exhaust-gas outlet 6.

Figure 2:
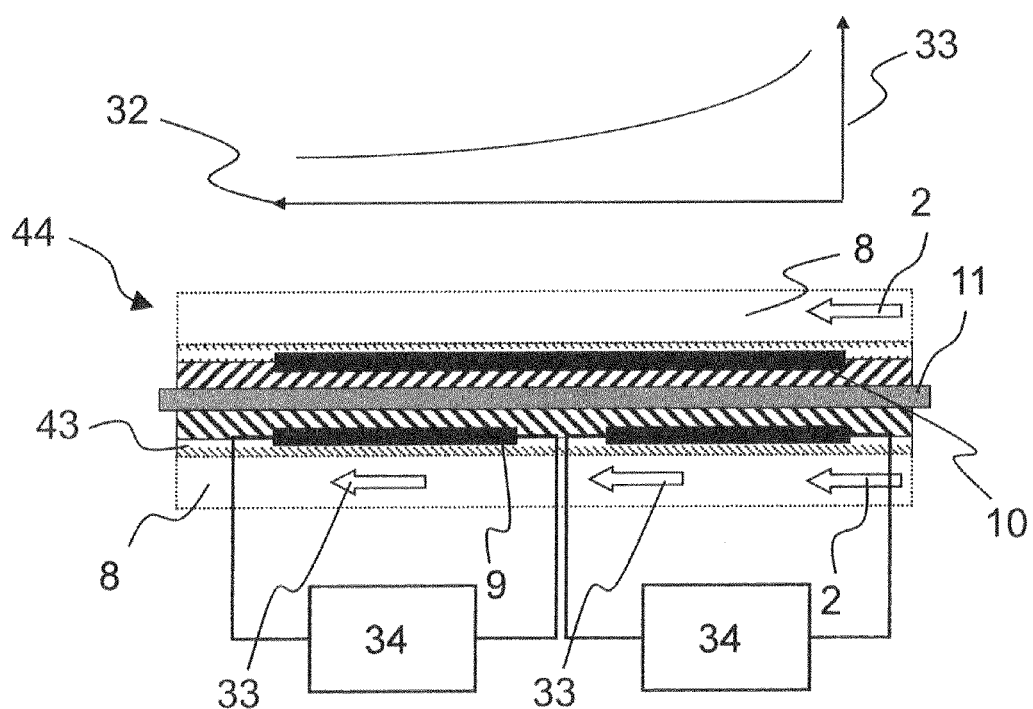
FIG. 2 is an enlarged, fragmentary, longitudinal-sectional view of a heat exchange unit as well as a diagram in which exhaust-gas temperature and flow path length are plotted.

FIG. 2 diagrammatically shows a construction of a heat exchange unit 44. The heat exchange unit 44 is positioned adjacent flow paths 8 disposed at both sides and hot exhaust gas 2 flows through the flow paths 8. The heat exchange unit 44 includes the internal cooling device 11, in such a way that in each case at least one thermoelectric element 9 is provided between the cooling device 11 and the flow paths 8. A diagram, which is additionally illustrated at the top of FIG. 3 for explanation, shows an exhaust-gas temperature 33 plotted over a length 32 of the flow path 8 or of the at least one thermoelectric element 9. The temperature on a side 10 of the thermoelectric element 9 which is situated opposite the flow path 8 is considerably lower due to the coolant device 11. This leads to the so-called Seebeck effect, in such a way that electrical current can be tapped off from the thermoelectric element 9 and the electrical current can be supplied to a battery 34. In this case, a protective layer 43 is provided, in particular, to prevent direct contact between the thermoelectric elements 9 or semiconductor elements with the exhaust gas 2.

Furthermore, a plurality of thermoelectric elements 9 of different type are disposed in series in the flow direction in at least one flow path 8. Those thermoelectric elements 9 are selected with regard to their efficiencies and with regard to the average prevailing exhaust-gas temperature 33 in each case. In this case, in a region of higher average exhaust-gas temperatures (at the right in FIG. 2), thermoelectric elements 9 are provided which have a high efficiency at high exhaust-gas temperatures 33. Thermoelectric elements 9 which have a correspondingly high efficiency at lower exhaust-gas temperatures 33 are provided in a left-hand part of the illustrated flow path 8. Accordingly, as large an amount of electrical current as possible can be gained from the thermal energy of the exhaust gas 2.

Figure 3:
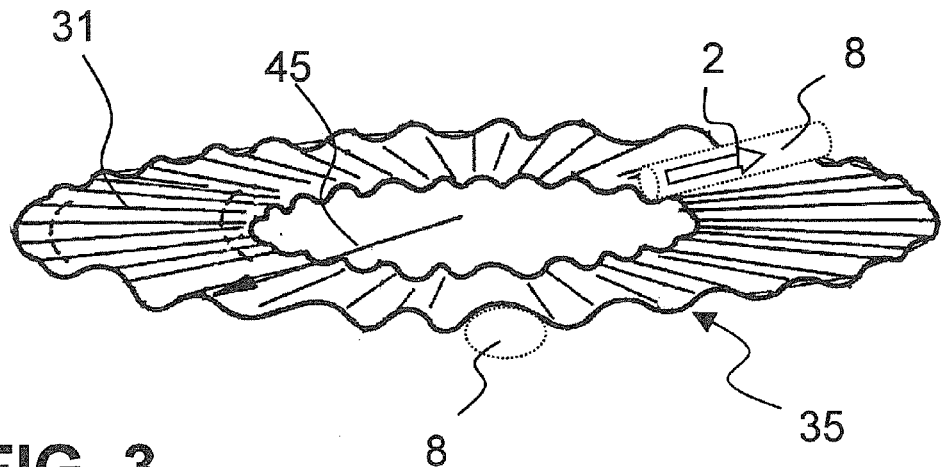
FIG. 3 is a perspective view of an example of a metal foil for constructing a heat exchange portion.

FIG. 3 shows an example of a metal foil 35 for constructing the heat exchange portion 7. The heat exchange portion 7 is formed from metal foils 35 which are stacked one on top of the other and accordingly form a radial honeycomb body, with flow paths 8 which run from the inside to the outside and through which the exhaust gas 2 can accordingly flow from the inside to the outside or from the outside to the inside. The metal foil 35 may be used in this case, in particular, for delimiting the flow paths 8 for the exhaust gas 2 and/or ducts for the cooling device 11. The metal foil 35 has an at least partially structured surface 31 which, in the circumferential direction of the metal foil 35, has elevations and depressions in an alternating fashion, in such a way that ducts running in the direction of a radius 45 are formed. The ducts may also run in spiral fashion, in such a way that elevations and depressions are formed which alternate in the direction of the radius 45. If a plurality of such metal foils 35 are stacked one on top of the other, the flow paths 8 and/or the cooling device 11 can be formed between them.

Figure 4:
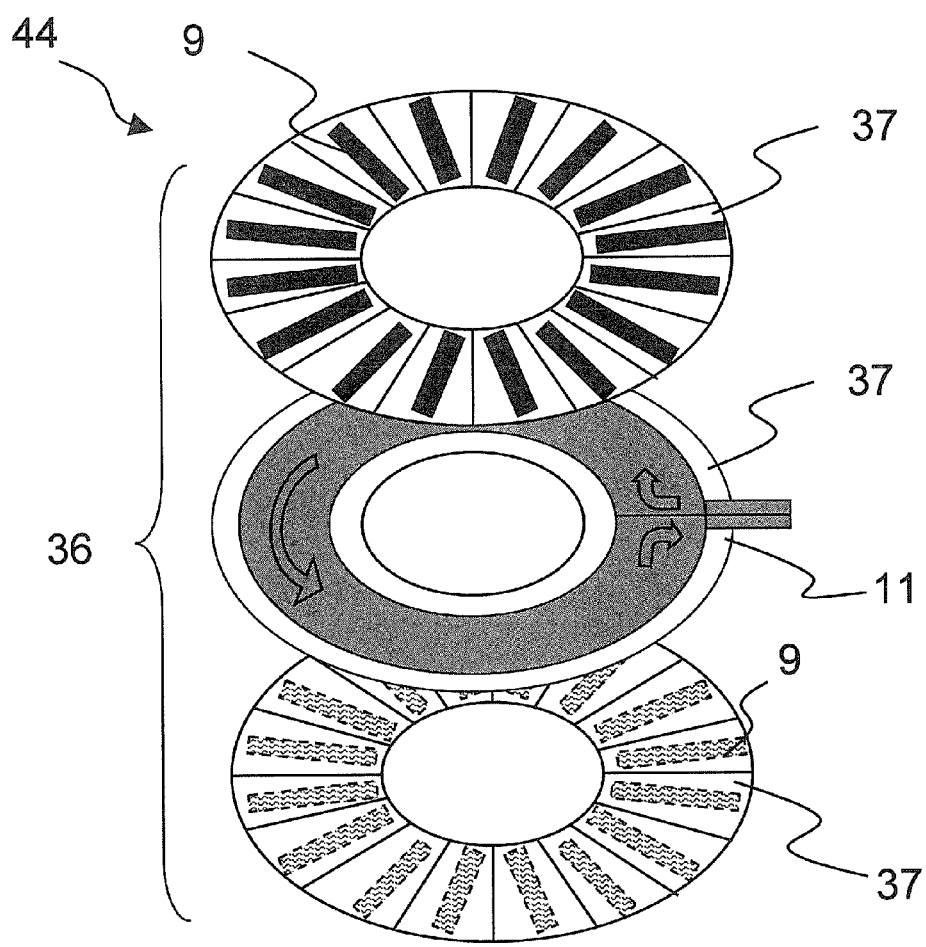
FIG. 4 is an exploded, perspective view showing a possible construction of a heat exchange unit.

FIG. 4 diagrammatically shows, in an exploded illustration, a possible construction of a heat exchange unit 44 in the form of a plate element 36. The plate element 36 includes an upper disk 37 illustrated at the top in FIG. 4. A radial configuration of the thermoelectric elements 9, in particular with a similar alignment of the ducts 8, is provided there. In addition, the heat exchange unit 44 has a central disk 37 in which the cooling device 11 is formed. For this purpose, the coolant flows into the cooling device 11, circulates around the disk 37 in the circumferential direction and then flows out again. It is nevertheless also possible for other flow directions and/or flow distributions of the coolant to be realized. Disposed below the central disk 37 is a further disk 37 which in turn has thermoelectric elements 9 that are illustrated therein merely by dashed lines, since they are situated on the underside of the illustrated disk 37.

Figure 5:
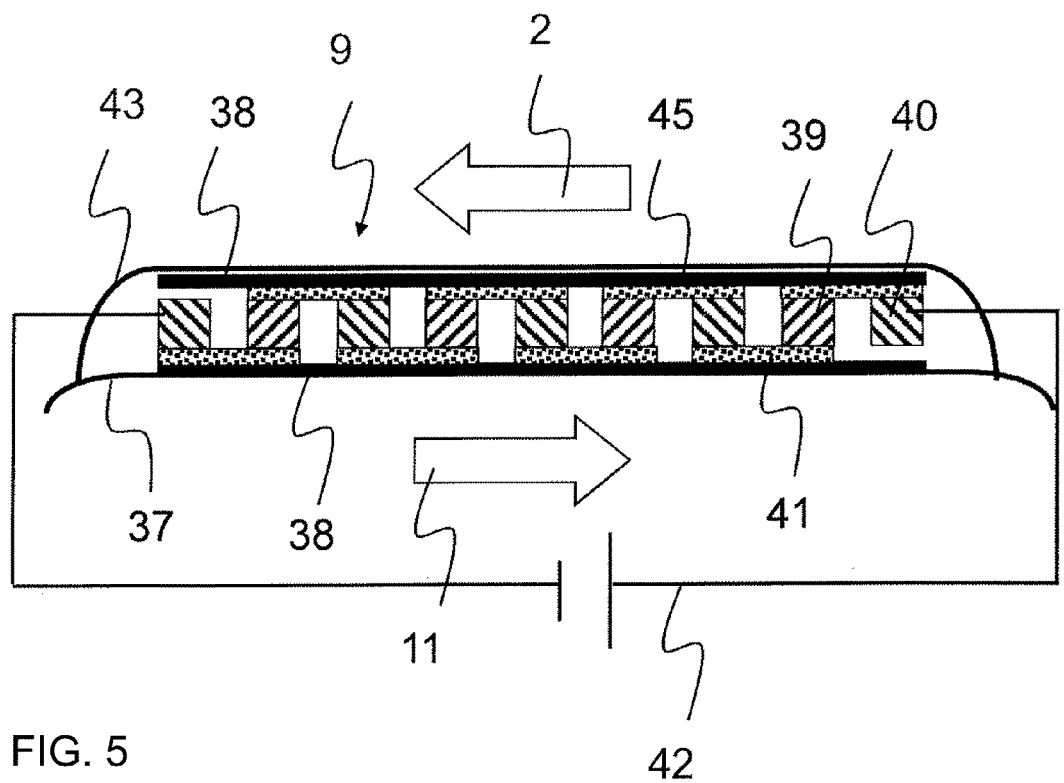
FIG. 5 is a fragmentary, longitudinal-sectional view of an upper part of a cooling device with a thermoelectric element.

FIG. 5 shows a partial section through an upper part of the cooling device 11 with a thermoelectric element 9. It should be pointed out, merely for the sake of completeness, that multiple thermoelectric elements 9, which are connected electrically in parallel and/or in series, are (generally) provided in a cooling device 11. A thermoelectric element 9 in this case is disposed gas-tightly between a protective layer 43 and a disk 37 of the cooling device 11 and is cohesively or materially connected to the disk 37. The thermoelectric element 9 includes multiple paired configurations of different semiconductor blocks (p-type semiconductor blocks 40 and n-type semiconductor blocks 39), which are alternately connected to metallic, electrically conductive bridges 41 on their upper and lower side. The bridges 41 are mounted on ceramic plates 38, so that a directional current flow is ensured through the bridges 41. If hot exhaust gas 2 then flows past the protective layer 43, this site heats up, while the opposite side is cooled by the coolant. Thermal energy can now be effectively converted into electrical energy according to the Seebeck effect.

Figure 6:
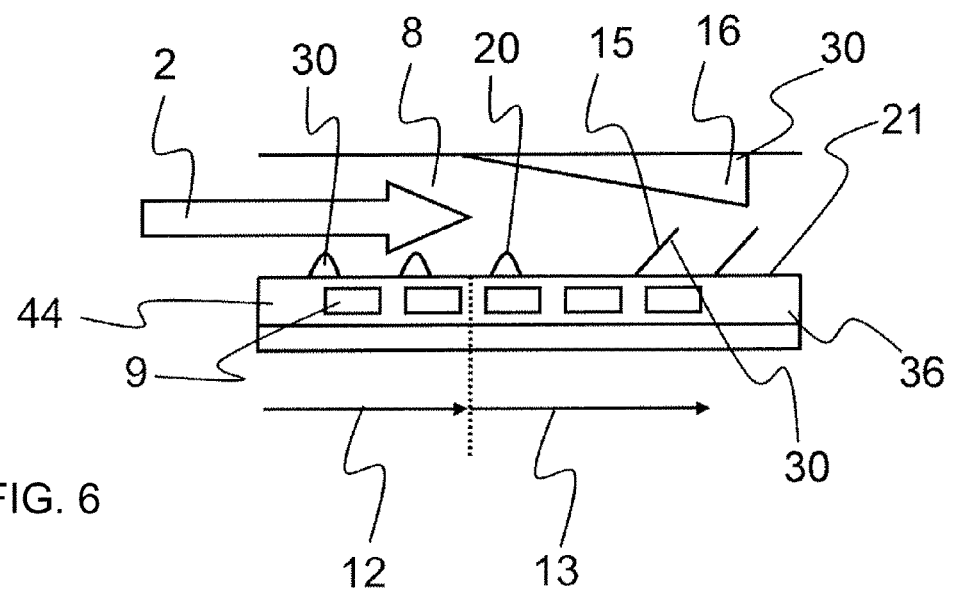
FIG. 6 is a longitudinal-sectional view of a flow path according to one refinement of the invention.

FIG. 6 diagrammatically shows a side view of a portion of a flow path 8 with a heat exchange unit 44. In this case, the hot exhaust gas 2 flows into the flow path 8, in which any laminar boundary flows that are present are broken up, in particular, by profilings or profiled sections 20 (elements for flow manipulation 30) on a first wall 21. The profilings, contours or sections are in direct thermally conductive connection with the thermoelectric elements 9, Furthermore, guide blades 15 (elements for flow manipulation 30) may also be provided which are likewise provided for producing turbulence in the exhaust-gas flow in order to thereby permit improved heat transfer from the exhaust gas 2 to the first wall 21. Furthermore, in particular on the first walls 21, there may be provided thermally conductive structures 16 (elements for flow manipulation 30) which have an additional heat capacity and which therefore firstly remove as large as possible an amount of thermal energy from the exhaust gas 2 and dissipate the thermal energy to the first walls 21, and secondly accumulate existing thermal energy from the exhaust gas 2 and dissipate the thermal energy to the first walls 21 continuously and with a slight time delay. Provided along the flow path 8 are first portions 12 and at least second portions 13, within which thermoelectric elements 9 of different types are provided in the plate element 36. In this case, a plurality of thermoelectric elements 9 of similar type may be disposed in series.

Figure 7:
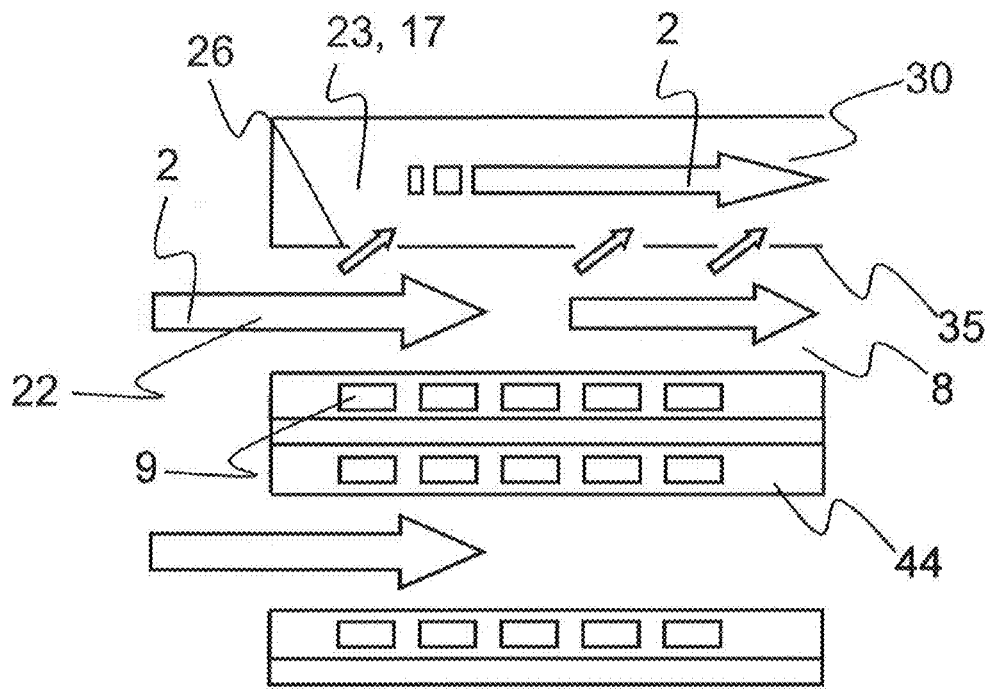
FIG. 7 is a longitudinal-sectional view of a flow path with a bypass flow path.

FIG. 7 diagrammatically shows a side view of a flow path 8 with a bypass flow path 23 or an overload protection device 17 introduced as an element for flow manipulation 30, in such a way that the heat exchange units 44 and in particular the thermoelectric elements 9 are protected from excessively high temperatures of the exhaust gas 2. The exhaust gas 2 flows into the flow paths 8 in such a way that, with increasing dynamic pressure 22, an increasing amount of exhaust gas 2 is transferred through a second wall 26, which is formed, in particular, by a metal foil 35, into an adjacent flow duct. In this case, flow paths 8 may also be formed so as to be conical over their extent (not illustrated herein), that is to say in particular to become narrower in the exhaust-gas flow direction. In this way, it is achieved in particular that, with increasing dynamic pressure 22 of the exhaust gas 2, an increasing amount of exhaust gas 2 is transferred through a porosity provided in the second wall 26 into the adjacent overload protection device 17 or the bypass flow path 23. In particular, the bypass flow path 23 is disposed between a plurality of flow paths 8, in such a way that exhaust gas 2 can flow through the second walls 26, into the bypass flow path 23 from a plurality of flow paths 8. The bypass flow path 23 may therefore, in particular, have different cross sections, in particular larger cross sections, than the flow paths 8.

Figure 8:
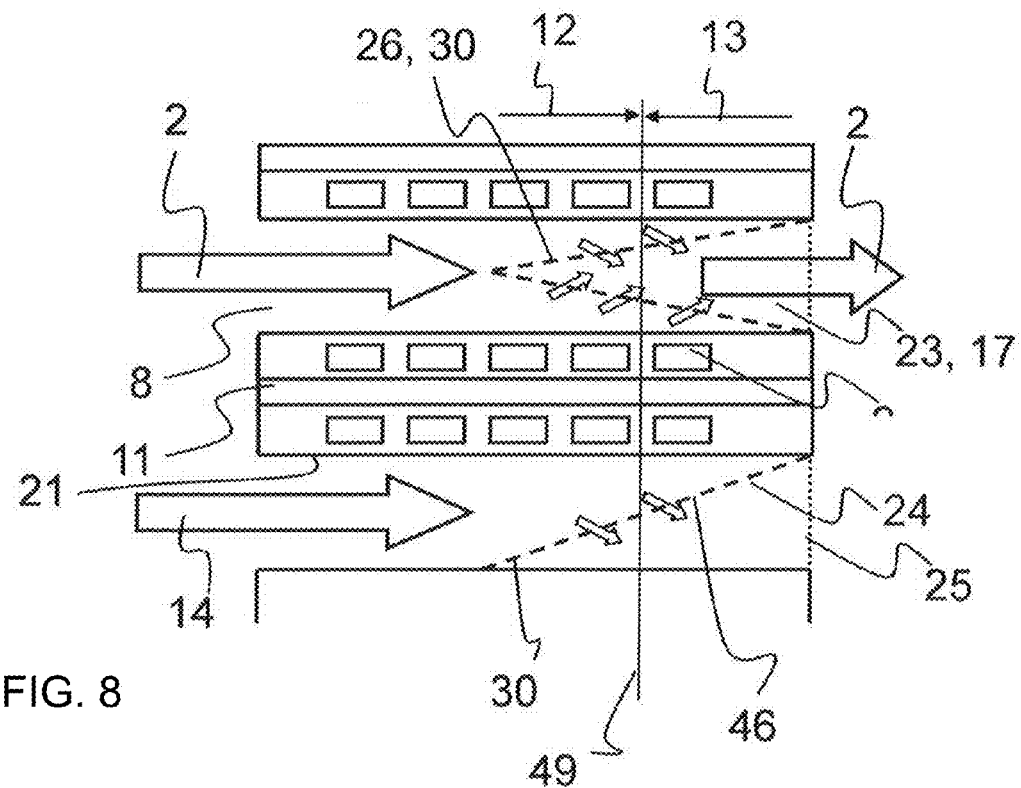
FIG. 8 is a longitudinal-sectional view of a flow path with a further refinement of the bypass flow path.

FIG. 8 diagrammatically shows a further advantageous embodiment of an overload protection device 17 or of a bypass flow path 23, which is provided within a flow path 8. In this case, in particular, a body 24 which tapers counter to the exhaust-gas flow direction within the flow path 8, is provided within the flow path 8 and is introduced as element for flow manipulation 30. In the upper part of FIG. 8, the body 24 is illustrated in the form of a cone. In the lower part of FIG. 8, the body 24 is formed by a bevel which extends counter to a flow direction 14 of the exhaust gas 2 proceeding from the first wall 21. The body 24 is formed by a second wall 26 which has a perforated construction, in such a way that exhaust gas 2 can flow through it. A base surface 25 of the body 24 is formed so as to be open, in such a way that the exhaust gas 2 can flow out of the flow path 8 through the base surface 25. With increasing dynamic pressure 22, the exhaust gas 2 within the flow path 8 will flow into the body 24, in particular over the entirety of the second wall 26, whereas at low dynamic pressure 22, the exhaust gas 2 flows along the second wall 26 to the end of the flow path 8 and the thermal energy of the exhaust gas 2 is, in particular, dissipated through the first wall 21 of the flow path 8 through the thermoelectric elements 9 to the cooling device 11. At high dynamic pressure 22, the exhaust gas 2 thus already flows through the second wall 26 into the bypass flow path 23, in particular in a first portion 12 of the flow path 8, and thereby no longer makes contact with the first walls 21. At low dynamic pressure 22, the exhaust gas 2 will first flow over into the bypass flow path 23, in particular through relatively large openings 46 of the second wall 26 in a second portion 13 of the flow path 8, in such a way that over the entire length of the flow path 8, the greater part of the exhaust gas 2 makes contact with the first walls 21.

Figure 9:
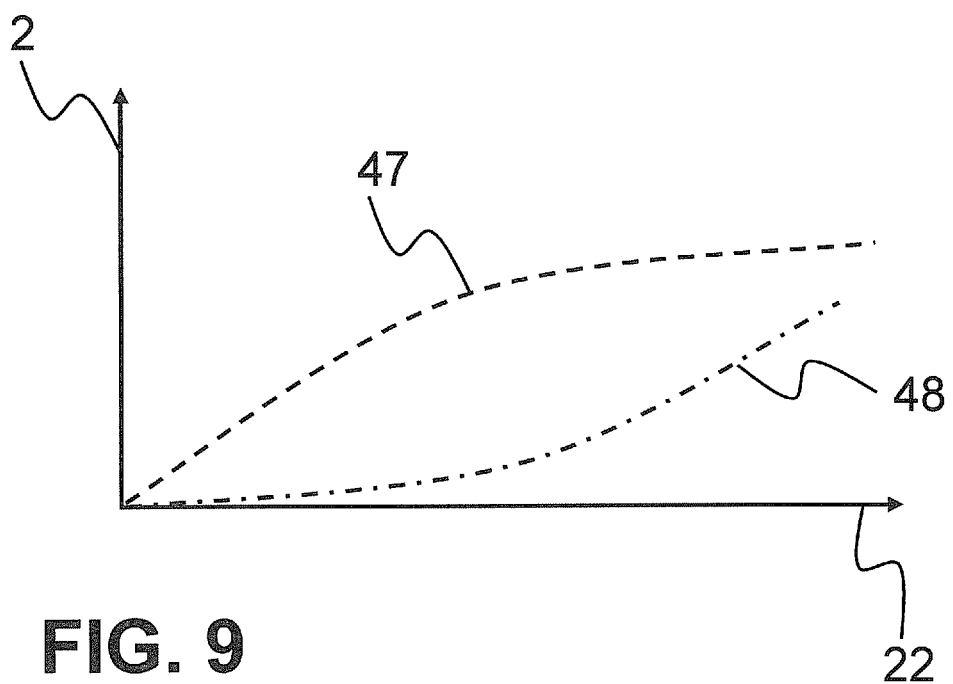
FIG. 9 is a graphic illustration of exhaust-gas flows through the flow path and bypass.

FIG. 9 shows the respective exhaust-gas flows firstly through the flow path/duct 8 and secondly through the bypass flow path 23 or the overload protection device 17. In this case, the amount of exhaust gas 2 flowing into the device 1 through the exhaust-gas inlet 5 preferably flows as a main exhaust-gas flow 46 through the flow path 8 and will only successively pass through a second wall 26, and then partially, for example, through the overload protection device 17 or the bypass flow path 23 as a bypass exhaust-gas flow 48, as a function of an increasing dynamic pressure 22.

In an embodiment of the bypass flow path 23 within the flow path 8, for example as a result of the provision of a body 24 corresponding to FIG. 8, FIG. 9 shows that at the coordinate 49 in FIG. 8, in this case too, with increasing dynamic pressure 22, an increasing amount of exhaust gas 2 has already flowed through the second wall 26 at the coordinate 49, and as a bypass exhaust-gas flow 48 is no longer in direct contact with the first wall 21.

The present invention contains at least three aspects which result in a significant refinement of the prior art:

1. concepts for flow manipulation in order to targetedly adjust the heat transfer from the exhaust gas to the thermoelectric elements,
2. concepts for realizing a (self-regulating) bypass as an overload protection device, and
3. concepts for the targeted construction of the thermoelectric elements for (diverse) flow conditions.

Even though these concepts have been explained herein in part in conjunction with one another and in fact result in synergetic advantages, a separate realization in relation to the known constructions of a thermoelectric generator may also provide significant improvements.

The invention claimed is:

1. A device for producing electrical energy from an exhaust gas of an internal combustion engine, the device comprising:
   a generator having an exhaust gas inlet, an exhaust gas outlet and a heat exchange portion disposed between said exhaust gas inlet and said exhaust gas outlet;
   said heat exchange portion having a multiplicity of flow paths for the exhaust gas, said flow paths including upstream portions immediately downstream of said exhaust gas inlet and downstream portions immediately upstream of said exhaust gas outlet, the exhaust gas being hotter in said upstream portions than in said downstream portions;
   a cooling device;
   thermoelectric elements at least partially surrounding said flow paths and having a side facing away from one of said flow paths and being in thermally conductive communication with said cooling device;
   at least one of said flow paths having at least one element for flow manipulation or different types of said thermoelectric elements being disposed at least along one of said flow paths; and
   thermally conductive structures disposed only in said downstream portions and configured to cause an increase in dissipation of residual heat of the exhaust gas from the exhaust-gas flow for improving efficiency of said generator and said thermally conductive structures not being disposed in said upstream portions to prevent overheating of said thermoelectric elements disposed in said upstream portions.

2. The device according to claim 1, wherein at least one of said flow paths has a first portion and at least one second portion, said thermoelectric elements have different efficiency maxima in relation to an average exhaust-gas temperature, and said thermoelectric elements are disposed in said first portion or in said at least one second portion of said at least one of said flow paths with regard to said different efficiencies.

3. The device according to claim 1, which further comprises at least one guide blade or a thermally conductive structure disposed in at least one of said flow paths.

4. The device according to claim 1, wherein at least one of said flow paths has first walls, and at least one structure or one profiling is disposed in said at least one of said flow paths.

5. The device according to claim 1, which further comprises a bypass flow path adjacent at least one of said flow paths, for at least partially transferring the exhaust gas within said at least one flow path into said adjacent bypass flow path with increasing dynamic pressure.

6. The device according to claim 5, wherein at least one of said flow paths has first walls, and said bypass flow path is formed by a body disposed in said at least one flow path, having an open base surface, tapering counter to a flow direction of the exhaust gas within said flow path and having a second wall through which the exhaust gas can flow.

7. The device according to claim 1, which further comprises at least one oxidation catalytic converter disposed upstream of said heat exchange portion.

8. The device according to claim 7, wherein said at least one oxidation catalytic converter is configured to be heatable.

9. The device according to claim 1, which further comprises at least one $NO_x$ accumulator disposed downstream of said heat exchange portion.

10. A method for producing electrical energy from an exhaust gas of an internal combustion engine, the method comprising:

providing a device including a generator having an exhaust gas inlet, an exhaust gas outlet and a heat exchange portion disposed between the exhaust gas inlet and the exhaust gas outlet;

providing the heat exchange portion with a multiplicity of flow paths for the exhaust gas, the flow paths including upstream portions immediately downstream of the exhaust gas inlet and downstream portions immediately upstream of the exhaust gas outlet, the exhaust gas being hotter in the upstream portions than in the downstream portions;

providing a cooling device;

at least partially surrounding the flow paths with thermoelectric elements having a side facing away from one of the flow paths being in thermally conductive communication with the cooling device;

increasing a dissipation of residual heat of the exhaust gas from the exhaust-gas flow for improving efficiency of the generator and preventing overheating of the thermoelectric elements disposed in the upstream portions, by providing thermally conductive structures only in the downstream portions and not in the upstream portions; and regulating a thermally conductive contact between the exhaust gas and the thermoelectric elements at least as a function of an overall mass flow or temperature of the exhaust gas, by providing at least one of the flow paths with at least one element for flow manipulation or different types of the thermoelectric elements disposed at least along one of the flow paths.

11. The method according to claim 10, which further comprises carrying out the step of regulating the thermally conductive contact between the exhaust gas and the thermoelectric elements in a self-regulating manner at least as a function of the overall mass flow or the temperature of the exhaust gas.

12. The method according to claim 11, which further comprises separating, with an overload protection device, an increasing amount of exhaust gas in terms of flow from first walls of a flow path in a self-regulating manner as a function of a dynamic pressure of the exhaust gas.

13. The method according to claim 10, which further comprises:

carrying out the method in a motor vehicle.

14. A motor vehicle, comprising:

an internal combustion engine; and a device for producing electrical energy from exhaust gas of the internal combustion engine, the device including:

a generator having an exhaust gas inlet, an exhaust gas outlet and a heat exchange portion disposed between said exhaust gas inlet and said exhaust gas outlet;

said heat exchange portion having a multiplicity of flow paths for the exhaust gas, said flow paths including upstream portions immediately downstream of said exhaust gas inlet and downstream portions immediately upstream of said exhaust gas outlet, the exhaust gas being hotter in said upstream portions than in said downstream portions;

a cooling device;

thermoelectric elements at least partially surrounding said flow paths and having a side facing away from one of said flow paths and being in thermally conductive communication with said cooling device; and at least one of said flow paths having at least one element for flow manipulation or different types of said thermoelectric elements being disposed at least along one of said flow paths; and thermally conductive structures disposed only in said downstream portions and configured to cause an increase in dissipation of residual heat of the exhaust gas from the exhaust-gas flow for improving efficiency of said generator and said thermally conductive structures not being disposed in said upstream portions to prevent overheating of said thermoelectric elements disposed in said upstream portions.

* * * * *